United States Patent
McQuade et al.

(10) Patent No.: US 6,661,244 B2
(45) Date of Patent: Dec. 9, 2003

(54) NICKEL ALLOY PROBE CARD FRAME LAMINATE

(75) Inventors: Francis T. McQuade, Watertown, CT (US); Zbigniew Kukielka, Plainville, CT (US); William F. Thiessen, Newtown, CT (US); Stephen Evans, Newtown, CT (US)

(73) Assignee: Wentworth Laboratories, Inc., Brookfield, CT (US)

( * ) Notice: Subject to any disclaimer, the term of this patent is extended or adjusted under 35 U.S.C. 154(b) by 0 days.

(21) Appl. No.: 10/060,160

(22) Filed: Jan. 30, 2002

(65) Prior Publication Data

US 2003/0146769 A1 Aug. 7, 2003

(Under 37 CFR 1.47)

Related U.S. Application Data

(63) Continuation-in-part of application No. 09/953,599, filed on Sep. 17, 2001, now Pat. No. 6,566,898, and a continuation-in-part of application No. 09/519,363, filed on Mar. 6, 2000.
(60) Provisional application No. 60/265,244, filed on Jan. 31, 2001.

(51) Int. Cl.⁷ .............................................. G01R 31/02
(52) U.S. Cl. ........................................ 324/754; 324/761
(58) Field of Search .............................. 324/754, 761, 324/762, 755, 765; 439/480, 824, 482

(56) References Cited

U.S. PATENT DOCUMENTS

| 3,930,809 A | 1/1976 | Evans |
| 4,382,228 A | 5/1983 | Evans |
| 4,599,559 A | 7/1986 | Evans |
| 4,719,417 A | 1/1988 | Evans |
| 4,975,638 A | 12/1990 | Evans et al. |
| 5,355,079 A | 10/1994 | Evans et al. |
| 5,416,429 A | 5/1995 | McQuade et al. |
| 5,623,213 A | 4/1997 | Liu et al. |
| 5,731,709 A | 3/1998 | Pastore et al. |
| 5,762,981 A | 6/1998 | Nitsche |
| 5,841,291 A | 11/1998 | Liu et al. |
| 5,848,465 A | 12/1998 | Hino et al. |
| 5,886,535 A | 3/1999 | Budnaitis |
| 5,959,461 A | 9/1999 | Brown et al. |
| 5,973,504 A | 10/1999 | Chong |
| 5,977,787 A | 11/1999 | Das et al. ............... 324/761 |
| 6,031,383 A | 2/2000 | Streib et al. |
| 6,099,286 A | 8/2000 | Nitsche |
| 6,124,723 A | 9/2000 | Costello |
| 6,160,412 A | 12/2000 | Martel et al. |
| 6,163,162 A | 12/2000 | Thiessen et al. |
| 6,255,602 B1 | 7/2001 | Evans et al. |
| 6,297,657 B1 | 10/2001 | Thiessen et al. |

FOREIGN PATENT DOCUMENTS

JP 404145637 A 5/1992

*Primary Examiner*—Vinh P. Nguyen
(74) *Attorney, Agent, or Firm*—Wiggin & Dana LLP; Gregory S. Rosenblatt

(57) ABSTRACT

A probe head assembly for use in a vertical pin probing device of the type used to electrically test integrated circuit devices has a metallic spacer portion formed from a plurality of laminated metallic layers. The laminated metallic layers are formed from a low coefficient of thermal expansion metal, such as Invar, a 36% nickel—64% iron alloy. By orienting the metallic grains of the laminated metal layers to be off-set from the orientation of metallic grains of adjacent metallic foil layers, increased strength and flatness is achieved.

15 Claims, 5 Drawing Sheets

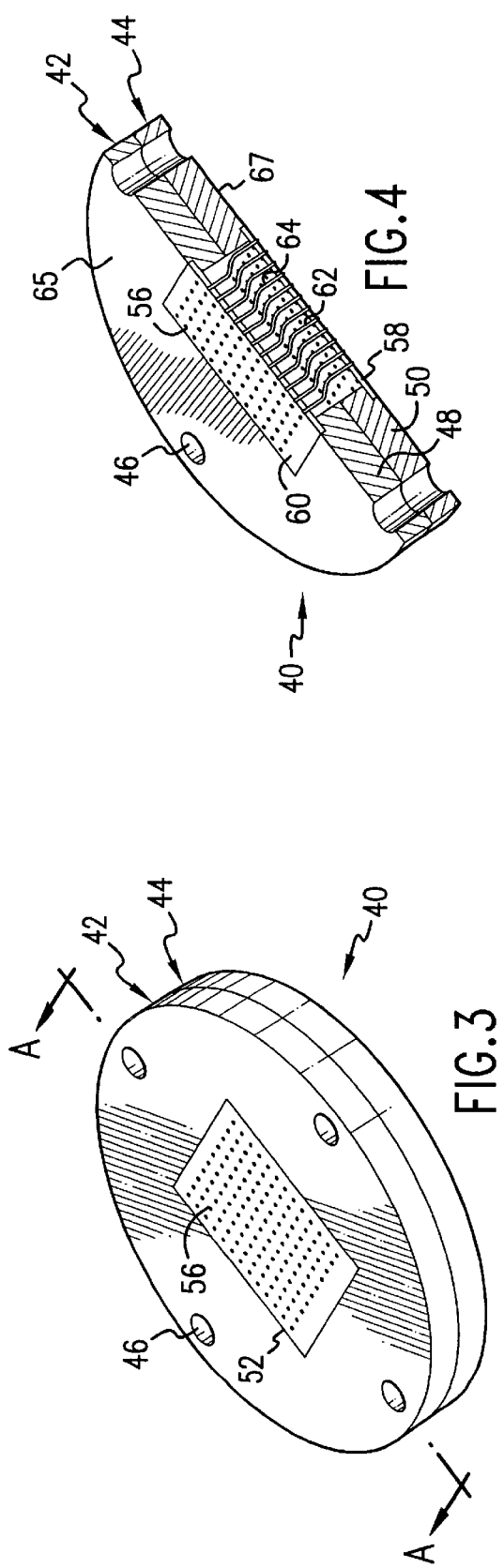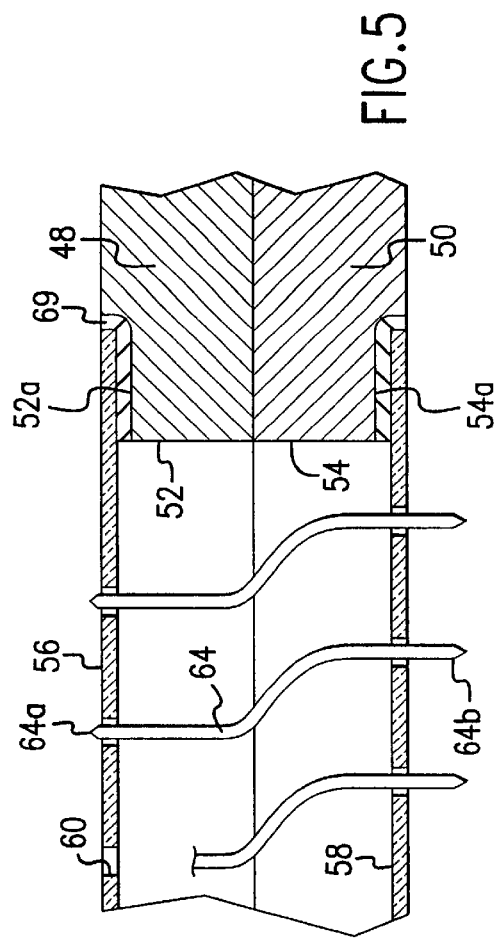

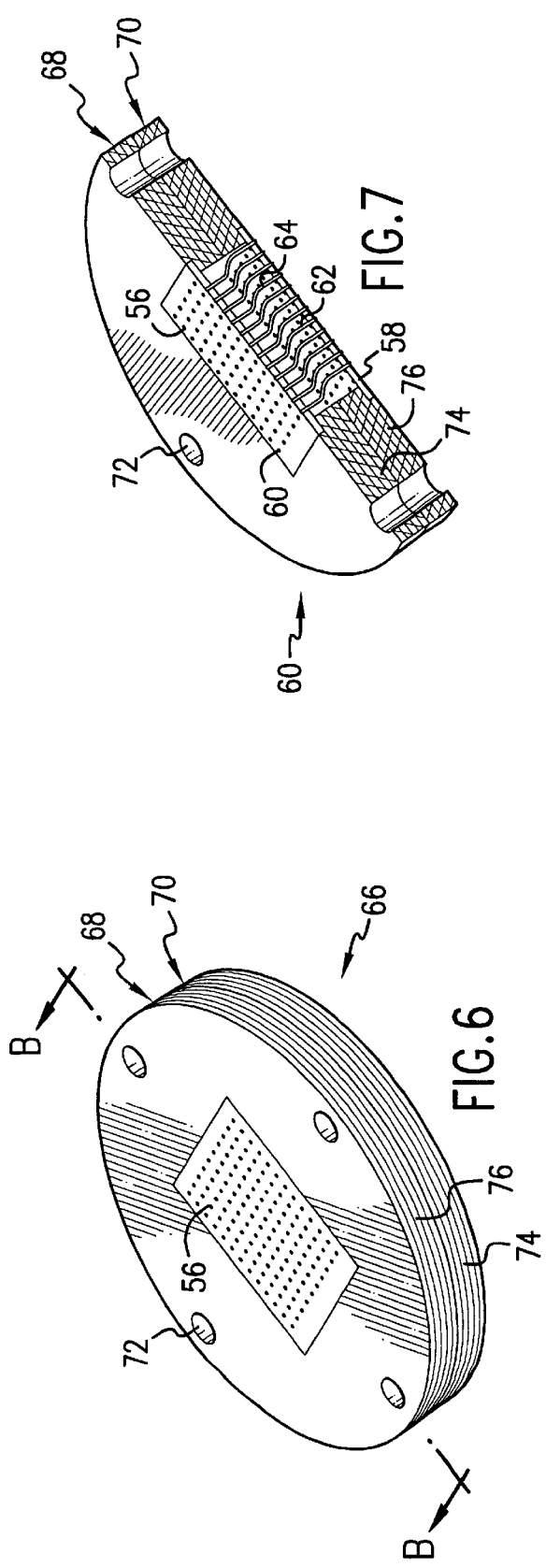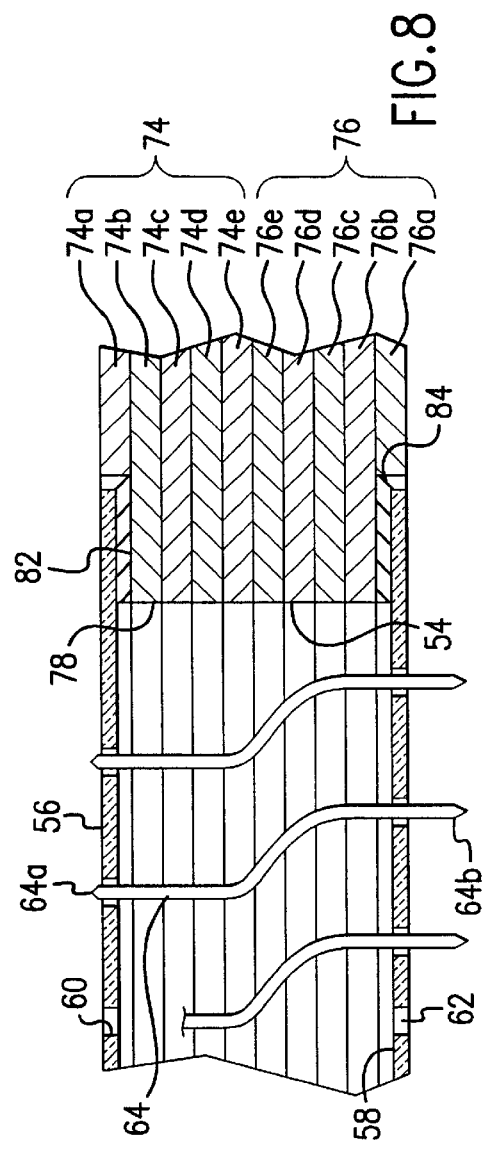

NICKEL ALLOY PROBE CARD FRAME LAMINATE

CROSS-REFERENCE TO RELATED PATENT APPLICATIONS

This patent application is a continuation-in-part of U.S. patent application Ser. No. 09/953,599 that was filed on Sep. 17, 2001 (now U.S. Pat. No. 6,566,898) and is in turn a continuation-in-part of U.S. patent application Ser. No. 09/519,363 that was filed on Mar. 6, 2000. In addition, this patent application relates to and claims priority to U.S. provisional patent application serial No. 60/265,244 that was filed on Jan. 31, 2001. The subject matter of patent application Ser. Nos. 09/953,599 and 09/519,363 as well as that of provisional patent application Ser. No. 60/265,244 is incorporated by reference herein.

BACKGROUND OF THE INVENTION

(1) Field of the Invention

The invention relates to a combination of an upper die and a lower die that guides small diameter test pins in semiconductor test equipment, such as a vertical pin probing device. More particularly, the upper die and the lower die have an apertured frame portion formed by laminating a plurality of relatively thin metallic layers of a low coefficient of thermal expansion (CTE) alloy. A low CTE ceramic insert having an array of holes seals the aperture and guides the small diameter test pins.

(2) Description of the Related Art

The manufacture of integrated circuits has progressed to where on the order of hundreds of individual integrated circuit (IC) chips are formed by photolithography on a single, relatively large, on the order of 8 inch in diameter silicon wafer. After manufacture and test, the individual chips are singulated for assembly into individual devices. Since it is easier to handle the relatively large silicon wafers, functionality testing of the chips is preferably conducted prior to singulation. A number of test devices are available to test the chips on the wafer. Integrated circuits in their wafer state are tested using probing devices, the probes of which are traditionally of cantilevered or vertical configuration. In a known type of vertical pin probing device, the probes are held between spaced upper and lower dies and are generally curved with a straight portion that protrudes substantially perpendicular through the lower die of the housing. As the wafer under test is raised into contact with the probing device, and then overdriven a few thousandths of an inch, the probes recede into the housing and the curved portion of the probe deflects causing spring force that provides good electrical contact with the integrated circuit pads.

Traditionally, the housing that guides the probe pins is made from a dielectric material, often a plastic such as Delrin®, trademark of E.I. dupont de Nemours & Co, Wilmington, Del. A number of IC test protocols involve testing chip functionality at two or more different temperatures, for example, 0° C. and 135° C. (32° F. and 275° F.). The plastic prior art probe housing expands with a significantly higher thermal expansion rate than that of the silicon base material of the IC wafer under test. The expansion differential causes a mismatch of the probe locations and the IC pad locations, a condition that not only results in failure to make satisfactory electrical contact, but may result in fatal damage to the IC due to probe penetration in the circuit region of the IC.

One solution to this problem is to dimensionally compensate the room temperature pitch dimensions of probes in the housing so that at the specified test temperature it will have expanded to provide a nearly exact match of probe and pad positions. Except for temperatures within a narrow range, this option requires separate probe devices for each specific temperature, thus greatly increasing the user's monetary investment in probe devices.

Another solution would be to find a plastic or other suitable dielectric that matches the coefficient of thermal expansion of the silicon wafer. To date, however, the most practical choices of dielectric materials have expansion rates much higher than silicon. Plastics generally have a limited high temperature capability, thereby preventing their uses -for high temperature probing of IC's.

U.S. Pat. No. 6,163,162 entitled, "Temperature Compensated Vertical Pin Probing Device" discloses forming the portion of the housing that guides the pins from a low CTE metal, Invar. Invar is a trademark of Imphy, S.A. Invar is an alloy having a nominal composition, by weight, of 36% nickel and 64% iron and a CTE that is approximately equal to that of silicon.

Invar is electrically conductive. To prevent the housing from electrically shorting the pins, the patent discloses coating the pin guiding recesses with a dielectric such as a polymer or ceramic. The dielectric may be disposed into the recesses as either a coating or as an insert. A disclosed polymer is Vespel®, a trademark of DuPont. A disclosed ceramic is Macor®, a trademark of Corning Glass Works, Corning, N.Y. Typically, if the dielectric is a ceramic, an anti-stick coating is applied to the ceramic. A suitable anti-stick coating is disclosed to be XYLAN® manufactured by Whitford Corporation.

U.S. Pat. No. 6,297,657 entitled, "Temperature Compensated Vertical Probing Device" discloses that rather than the die housing being a machined block of Invar, multiple layers of Invar foil may be coated with an adhesive and laminated together to form the die housing. This construction is also electrically conductive and requires the pin guiding recesses to be coated with a suitable dielectric. The disclosures of the 6,163,162 patent and of the 6,297,657 patent are both incorporated by reference in their entireties herein.

Spacing between circuit traces on the chips under test are on the order of a few microns. As a result, the probe head assembly has extremely tight tolerances. The frame must be extremely flat and accurately machined. This has proven cumbersome for large Invar frames having a thickness on the order of 0.1 inch that may further contain machined pockets with a depth on the order of 0.09 inch for holding up to 4000 probes with a 0.006 inch pitch. In addition to the time and expense associated with complex, traditional machining processes, removing large amounts of metal across a thin frame tends to stress and deform the frame resulting in high rates of rejection for the finished machined part.

There therefore exists a need for a relatively low-cost process for the manufacture of probe card frames characterized by precision forming, a low rate of rejection and a substantial absence of internal stresses imparted by machining.

BRIEF SUMMARY OF THE INVENTION

The above-stated objects, features and inventions will become more apparent from the specification and drawings that follow.

BRIEF DESCRIPTION OF THE DRAWINGS

FIG. 3 is a top planar view of a die in accordance with the invention for use in a vertical pin probing device.

FIG. 4 is a cross-sectional view of the die of FIG. 3.

FIG. 5 is a magnified cross-sectional view of a portion of the die of FIG. 3.

FIG. 6 is a top planar view of a die in accordance with an alternative embodiment of the invention for use in a vertical pin probing device.

FIG. 7 is a cross-sectional view of the die of FIG. 6.

FIG. 8 is a magnified cross-sectional view of a portion of the die of FIG. 6.

DETAILED DESCRIPTION

Figure 1:
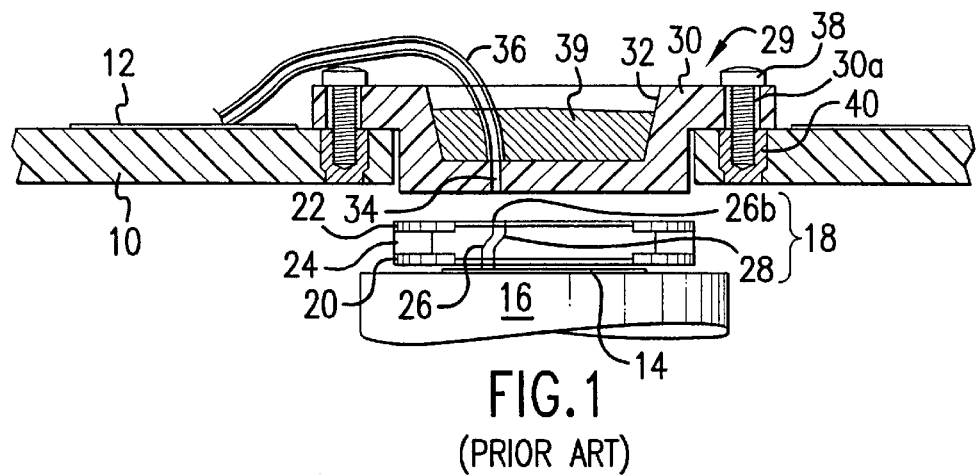
FIG. 1 is a cross sectional view of a vertical pin probing device as known from the prior art.
Figure 2:
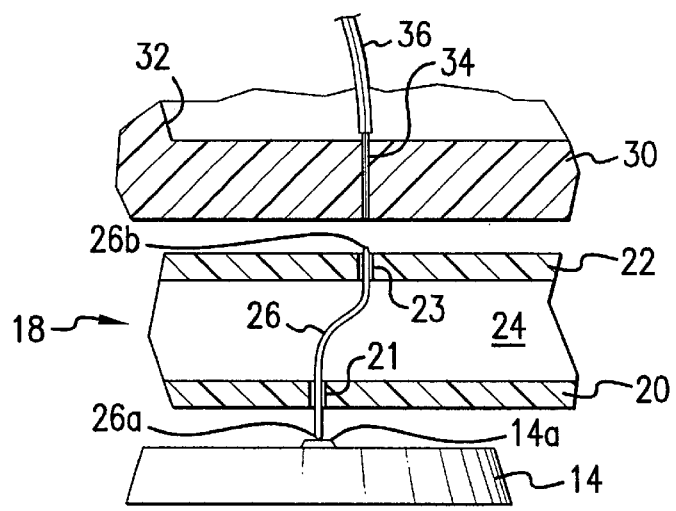
FIG. 2 is a magnified cross sectional view of a die portion of the vertical pin probing device of FIG. 1.

FIGS. 1 and 2 illustrate a vertical pin probing device used with an interconnecting device called a "space transformer" and a printed circuit board as known from the prior art. With reference to FIG. 1, a printed circuit test board 10 sometimes called a "probe card" includes conductive traces 12 which are connected in test circuit relationship to integrated circuit test equipment (not shown). In practice, the traces 12 lead to "pogo pads" on the printed circuit board, to which the external test equipment leads are connected in a prescribed test. An integrated circuit 14 or other device under test is supported on a movable chuck 16. Integrated circuit 14 typically has a pattern or matrix of contact pads to be simultaneously probed by a vertical-pin integrated circuit probe head assembly 18, such as the COBRA® probe head sold by Wentworth Laboratories of Brookfield, Conn. Typically, the IC will be one of a large number of chips have circuit features that were formed by photolithography on a silicon, or gallium arsenide, wafer. After testing, the chips are separated, sometimes referred to as singulation. Probing device 18 includes a first die 20 with an array of first holes and second die 22 with an array of second holes separated by a spacer 24 and carrying multiple vertical pin probes 26, 28. The die materials are typically made of a plastic insulating material such as Delrin® acetyl resin.

FIG. 2 is an enlarged cross-sectional view that illustrates representative probe 26 which includes a probe tips 26a protruding from one of the first array of holes 21 and probe head 26b protruding from one of the second array of holes 23. The holes 21, 23 containing the opposite ends of the vertical probe pin 26 are slightly offset from one another and the probe pins are curved in a snake-like configuration to promote buckling, so as to create substantially uniform contact pressure on the integrated circuit pad 14a despite any slight vertical unevenness or misalignment.

With reference back to FIG. 1, space transformer 29 includes a mounting block 30 with a well 32 formed therein. At the bottom of the well, a number of holes 34 are laid out to dimensionally correspond to a first small inner pattern defined by the exposed heads 26b of the probe head assembly 18. The probe head assembly 18 is shown separated from the space transformer 29 for clarity but is connected thereto in actual operation by screws (not shown).

An individual insulated wire 36 is connected to PCB trace 12 at one end and on the other end, the wire extends into a hole 34 in the mounting block 30 so as to be in electrical contact with probe head 26b on the underside of block 30 when the probe head assembly 18 is bolted to the space transformer 29.

Space transformer 29 is attached to the PC board by means such as screws 38, and an epoxy potting compound 39 immobilizes wire 36. The probe head assembly 18 is attached to the underside of space transformer 29 by screws (not shown), so that probe head 26b makes electrical contact with wire 36. The integrated circuit 14 has a number of spaced contact pads 14a that are in physical contact, and electrical continuity, with probe tip 26a during a functionality test. If the coefficient of thermal expansion of the die material is substantially different from the coefficient of thermal expansion of the silicon wafer (approx. $1.6 \times 10^{-6}$ inch/inch/° F. that is approx. $2.8 \times 10^{-6}$ m/m/° K) probe tip 26a may not effectively contact the contact pad 14a over a range of test temperatures.

Referring now to FIGS. 3, 4 and 5, the improved temperature compensated vertical pin probe head assembly is indicated generally by reference numeral 40 and include a first die member 42 and a second die member 44. The dies are held together and mounted to the mounting block 30 (shown in FIG. 1) by screws or other fasteners (not shown) passing through suitably placed holes 46 around the perimeter. Each of the first and the second die members 42, 44 includes a spacer member 48, 50 respectively with an aperture 52, 54 respectively. The apertures 52, 54 may be any suitable shape to conform to the IC under test and are typically rectangular in shape. The apertures 52, 54 are sealed by a thin dielectric sheet 56, 58 respectively.

The spacer members 48, 50 are fabricated from a substrate core material having a coefficient of thermal expansion as close as possible to that of the silicon making up the circuit substrate. One preferred material is Invar. Invar has a coefficient of thermal expansion of $1.0 \times 10^{-6}$ inch/inch/° F. ($1.8 \times 10^{-6}$ meter/meter/° K) at a nominal weight composition of 36% nickel, which is slightly less than that of silicon. The thermal coefficient of expansion may be varied so as to coincide exactly with that of silicon, if desired, by adjusting the percentage of nickel in the alloy as known in the art. (Sisco, *Modern Metallurgy for Engineers* 2nd Edition p. 299). Other low CTE metals and metal alloys having a CTE within about $4 \times 10^{-6}$ inch/inch/° F. that of silicon may also be used.

Dielectric sheets 56, 58 are formed from any rigid dielectric having a CTE within about $4 \times 10^{-6}$ inch/inch/° F. that of silicon and maintain structural integrity over the range of test temperatures. Suitable materials include ceramics and glasses with silicon nitride ceramic (CTE=$1.7 \times 10^{-6}$ inch/inch/° F.) being most preferred.

As previously known in the art, probe pins 64 extend between the pattern of spaced and offset holes 60, 62 in the dielectric sheets 56, 58 supported by spacer members 48, 50 of first and second die members 42, 44 respectively. One end of the probe pin 64 terminates in probe tip 64a which is disposed and makes electrical contact with wires (such as 36 of FIG. 1) leading to the printed circuit test board. The opposing end of the probe pin 64 terminates in a probe tip 64b which slides in hole 62 in known manner during probing of a wafer under test.

Referring to the cross sectional view of FIG. 4 taken along lines A—A of FIG. 3, it is seen that the periphery of the first dielectric sheet 56 is mounted on a first surface 65 of spacer member 48 and second dielectric sheet 58 is mounted on a first surface 67 of spacer member 50, so that the two dielectric sheets are held apart in spaced relationship. The first dielectric sheet 56 contains a plurality of holes 60 drilled by laser or other suitable means in a predetermined first pattern of holes. The second dielectric sheet 58 contains a plurality of holes 62 similarly drilled by laser or other suitable means in the same predetermined pattern, except that the pattern is offset from the first pattern by a small amount, typically on the order of 0.02 inch.

With reference to the enlarged cross sectional drawing of FIG. 5, which is not to scale, aperture 52 in spacer member 48 is enlarged about its periphery in the first surface 65 to provide a ledge 52*a*, and a similar peripheral ledge 54*a* is provided in the first surface of spacer member 50. The first dielectric sheet 56 is relatively thin (nominally 10 mils) and the second dielectric sheet is also relatively thin, but typically thicker than the first sheet, with a preferred nominal thickness of about 20 mils. The dielectric sheets 56, 58 are mounted to span the apertures 52, 54 and are bonded to ledges 52*a*, 54*a* respectively by a high strength rigid adhesive, such as an epoxy, or other suitable means.

In accordance with the present invention, we have discovered that silicon nitride ceramic is ideally suited for the dielectric sheets 56, 58 used in the improved vertical pin probing device. Silicon nitride ceramics offer high mechanical strength at elevated temperatures, thermal shock resistance and toughness as well as having a low coefficient of friction to enable sliding of the probe pins without the necessity of a coating of anti-stick material. The silicon nitride sheet is normally produced by hot pressing and is a two phase, alpha and beta, polycrystalline ceramic. It has a coefficient of thermal expansion of $1.7 \times 10^{-6}$ inch/inch/° F. ($3.4 \times 10^{-6}$ meter/meter/° K), which is only slightly greater than the coefficient of thermal expansion of silicon. Since the thermal coefficient of the spacer member 48, 50 is slightly less than that of silicon and the thermal coefficient of silicon nitride is slightly greater than that of silicon, the two materials used in the die member cooperate with one another to cause the overall thermal coefficient of the die member to closely approximate that of the silicon wafer.

An alternative embodiment of the invention is illustrated in FIGS. 6, 7 and 8 which correspond to FIGS. 3, 4 and 5 respectively. Rather than using a spacer member of solid Invar, we have found that a laminated Invar spacer offers significant advantages in terms of ease of construction and improved performance over the solid Invar spacers 48, 50 of the type illustrated in FIGS. 3–5.

Referring to FIGS. 6, 7 and 8, an alternative temperature compensated vertical pin probe head assembly is indicated generally by reference numeral 66 and includes a first die member 68 and a second die member 70. The dies are held together as previously described by screws (not shown) passing through suitably placed holes 72 around the perimeter. First and second die members 68, 70 include a first spacer member 74 and a second spacer member 76, respectively provided with apertures 78, 80 respectively. Each aperture 78, 80 is covered by a thin dielectric sheet 56, 58 respectively, which may be the same as previously described in connection with FIGS. 3–5.

The spacer members 74, 76 are fabricated by chemically etching them from Invar foil or another suitable low CTE metallic foil and adhering the laminations together with an adhesive. First spacer 74 is composed of laminations 74*a*, 74*b*, 74*c*, 74*d*, 74*e* and second spacer 76 is composed of laminations 76*a*, 76*b*, 76*c*, 76*d*, 76*e*. The laminations or foils are bonded together in a laminated structure. A suitable adhesive is 3M (Minneapolis, Minn.) structural adhesive #2290, which is sprayed on and bonds under heat and pressure. The support holes 72 may be etched at the same time as the central hole or aperture is etched in the lamination, which greatly facilitates the construction and avoids drilling holes through solid Invar as in the construction of FIGS. 3–5. A suitable thickness for Invar foils used to make the laminated spacers 74 and 76 is 10 mils. This requires a stack of approximately 4 to 6 foils in a typical application to make a spacer.

Probe pins 64 extend between the pattern of spaced and offset holes 60, 62 in the dielectric sheets 56, 58. First ends of the probe pins 64 terminate in probe pin tips 64*a* which are disposed and make electrical contact with the wires such as 36 (FIG. 1) leading to the printed circuit test board. Opposing ends of the probe pins 64 terminate in probe tips 64*b* which slide in holes 62 in a known manner during probing of wafer 14 (FIG. 1).

Referring to cross sectional view, FIG. 7, taken along lines B—B of FIG. 6, first dielectric sheet 56 is mounted on a first side of spacer member 74 and second dielectric sheet 58 is mounted on a first side of spacer member 76, so that the two dielectric sheets are held apart in spaced relationship. The first and second dielectric sheets 56, 58 contain patterns of holes 60, 62 respectively. The patterns are identical except that the pattern in dielectric sheet 58 is offset from the pattern in dielectric sheet 56, as before.

Referring to the enlarged cross sectional-drawing of FIG. 8 (which is not to scale) a portion of the probe assembly is illustrated. The outermost lamination layer 74*a* is etched to provide a larger opening that the underlying lamination layers 74*b*, 74*c*, 74*d*, 74*e*, so as to provide a peripheral recess for receiving dielectric sheet 56. The outermost lamination 76*a* is etched with larger openings than lamination layers 76*b*, 76*c*, 76*d*, 76*e* to provide a recess for dielectric sheet 58. The etching process is an easier way to create peripheral ledges to retain the ceramic sheets than machining solid Invar block spacers as used in FIGS. 3–5. The dielectric sheets 56, 58 are held in the recesses by adhesive at 82, 84. A suitable adhesive is the 3M Structural Adhesive #2290 or a high strength rigid epoxy. Preferred adhesives are self-leveling, sprayed polymer adhesive such as a b-staged epoxy, although other thermally compliant polymers may also be used.

The resultant laminate can therefore achieve geometries which are impossible if machined from a solid piece of metal and which, in other cases, are more accurate and easily achieved compared to those produced by alternative methodologies.

Figure 9:
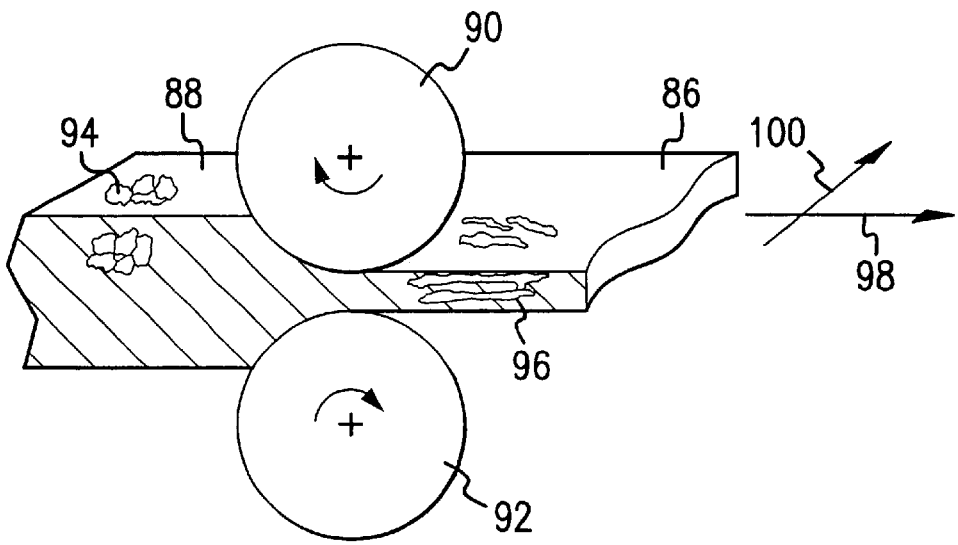
FIG. 9 is a schematic diagram of how a metal strip acquires an anisotropic grain structure during rolling as known from the prior art.

Improved structural strength and flatness are achieved by aligning adjacent layers of Invar foil one atop another in a rotated fashion. With reference to FIG. 9, the manufacture of foil 86 for forming into the lamination layers often involves the reduction in thickness of metal stock 88 by passing through a pair of rolls 90, 92 in a rolling mill. The rolls reduce the thickness of the metal stock to a desired thickness for foil in one or more passes. The metal stock 88 is made up of metallic grains 94 that are substantially the same length along all axes. After rolling, the grains 96 are elongated in a direction 98 longitudinal to the rolling direction. The grain width in a direction 100 transverse to the rolling direction is substantially unchanged. As a result, there is a tendency for the foil to have anisotropic properties imparted to it and tends to curl slightly in the longitudinal 98 direction. When layers of foil are laminated in such a way that each successive layer has the same grain orientation, the effect the tendency to curl is reinforced detrimentally impacting the flatness of the composite spacer member.

Figure 10:
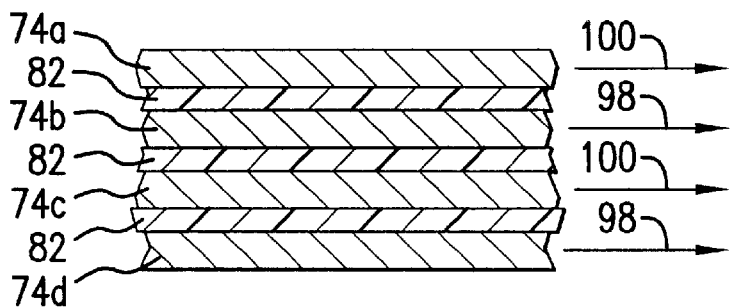
FIG. 10 is a perspective view of die lamination layers oriented according to grain structure in accordance with an embodiment of the invention.

Altering the orientation of successive layers of foil results in a foil having superior flatness and strength. One preferred orientation, as illustrated in FIG. 10 is to rotate alternating foil lamination layers 74a, 74b, 74c, 74d by 90° relative to an adjacent foil layer such that the orientation of each adjacent layer is offset by 90° from an adjacent layer as illustrated by grain orientation arrows 98, 100. Other orientations, such as alternating foil layer rotations through a range of approximately 10° to 45° degrees are also acceptable. It is not necessary for each foil layer to be offset relative to each adjacent layer, only at least one foil lamination layer offset relative to another one of the foil lamination layers.

Figure 11:
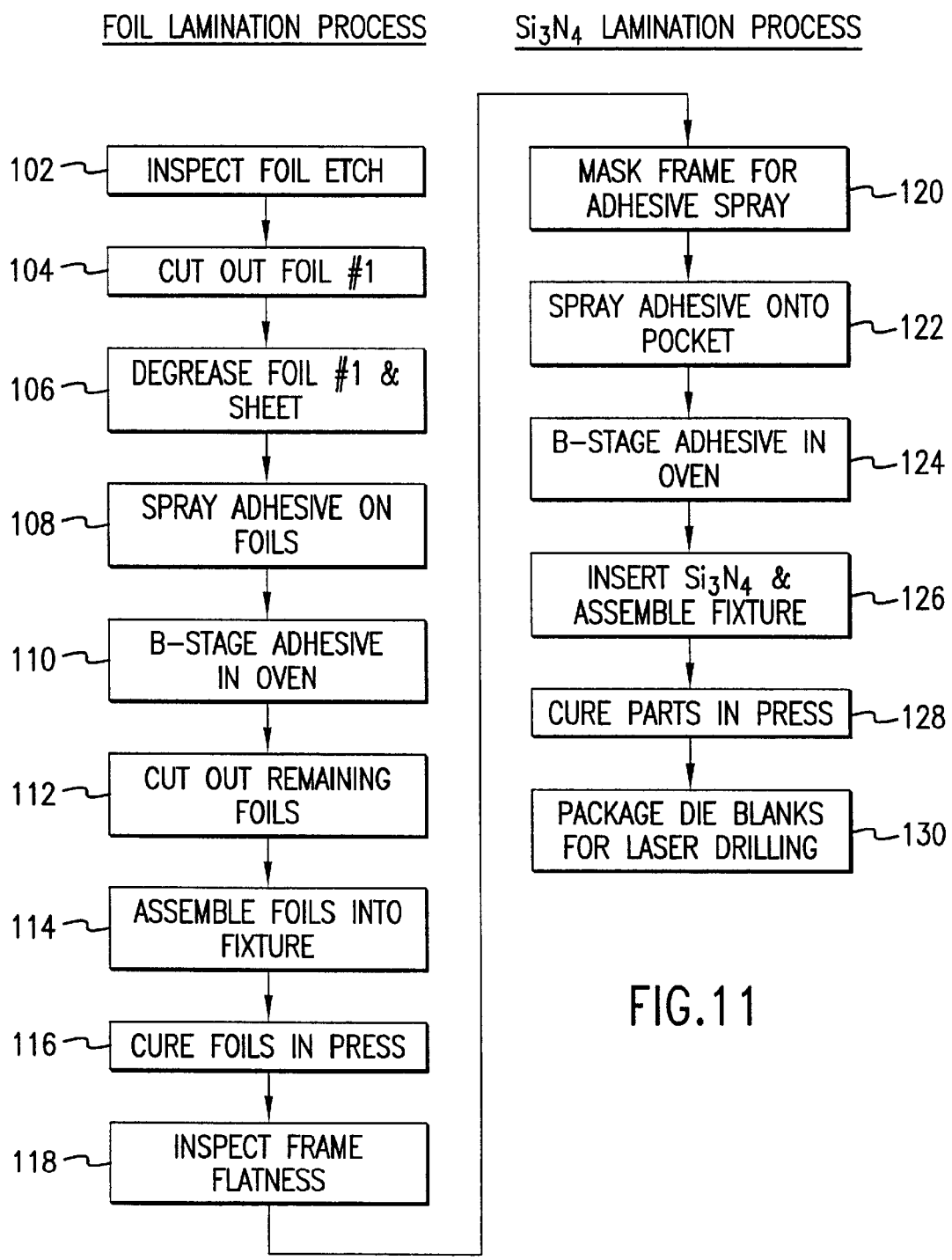
FIG. 11 shows in block diagram a method for the manufacture of a die frame for use with the die of FIG. 6.

FIG. 11 illustrates a process flow for the manufacture of an Invar die in accordance with the invention. Features are formed into a plurality of die lamination layers, such as by chemical etching. The foil etch is inspected 102 to insure the features are properly dimensioned and the foil was not damaged during etching. A first die lamination layer is removed 104 from the foil, such as by cutting. This first die lamination layer is then degreased 106 in an appropriate solvent, such as an HFC (hydrofluorocarbon) solvent. An adhesive layer, such as an epoxy, is sprayed 108 onto the first die lamination layer and then partially cured, referred to as b-staging, by heating 110 in an oven.

The remaining die lamination layers are then separated 112 from the foil, degreased and coated with an adhesive layer. The die lamination layers are assembled 114 in a fixture to provide proper alignment and then the die formed by laminating 116 under heat and pressure. The laminated die frame is inspected for flatness 118. Generally a deviation of less than 0.0002 inch per inch is required.

The periphery of the outermost die lamination layer is masked 120, such as with plater's tape and the ledge is sprayed 122 with an adhesive. This adhesive is partially cured, b-staged 124, in an oven and a silicon nitride sheet inserted 126 to span the aperture supported by the ledge. The assembly is cured 128 by heating to adhesively bond the sheet to the ledge. An array of holes is then formed in the sheet, such as by laser drilling.

The operation of the invention may be described as follows. Since the Invar material has a coefficient of thermal expansion slightly lower than, but substantially matching, that of the silicon, the Invar dies expand substantially so as to dimensionally correspond to the expansion of the silicon wafer. Therefore the location of the centerlines of dielectric sheets and holes are located in accordance with the contact pads on the silicon wafer, and follow the expansion and contraction of the silicon wafer.

The dielectric sheets may expand and contract about their own centerlines with a slightly higher coefficient of thermal expansion than the silicon wafer and the spacer members. However, the inserts are restrained by the adhesive and only permitted to expand in a direction perpendicular to the plane of the wafer. Therefore, despite the fact that the coefficient of thermal expansion of the insulated inserts may be slightly higher than that of the silicon wafer, it does not cause any significant mismatch between wafer contact pads and probe points over a large temperature range. The lubricity provided by the preferred ceramic material allows the probe pins to slide without requiring an anti-stick coating.

While there has been described what is considered to be the preferred embodiment of the invention and one modification thereof, other modifications will occur to those skilled in the art, and it is desired to secure in the appended claims all such modifications as fall within the true spirit and scope of the invention.

We claim:

1. A probe head assembly suitable for use in a vertical pin probing device, comprising:

a first spacer member having a first innermost surface and a first outermost surface and a centrally disposed first aperture, a first dielectric sheet spanning said first aperture adjacent said first outermost surface, said first dielectric sheet having a first set of through-holes defining a pattern;

a second spacer member having a second innermost surface and a second outermost surface and a centrally disposed second aperture, a second dielectric sheet that is substantially parallel to said first dielectric sheet spanning said second aperture adjacent said second outermost surface, said second dielectric sheet having a second set of through holes defining said same pattern but horizontally off-set from vertical alignment with said first set of through holes, wherein said second innermost surface is adjacent said first innermost surface; and at least one of said first spacer member and said second spacer member being a composite formed of a plurality of lamination layers of a low coefficient of thermal expansion metal alloy foil laminated together wherein at least a first lamination layer and a second lamination layer have non-aligned elongated metallic grains.

2. The probe head assembly of claim 1 wherein both said first spacer member and said second spacer member are composites formed of a plurality of lamination layers of a low coefficient of thermal expansion metal alloy foil laminated together wherein at least a first lamination layer and a second lamination layer have non-aligned elongated metallic grains.

3. The probe head assembly of claim 2 wherein said lamination layers have a coefficient of thermal expansion that is within $4 \times 10^{-6}$ inch/inch/° F. the coefficient of thermal expansion of an integrated circuit device under test.

4. The probe head assembly of claim 3 wherein said dielectric layer is a ceramic with a coefficient of thermal expansion within $4 \times 10^{-6}$ inch/inch/° F. the coefficient of thermal expansion of said lamination layers.

5. The probe head assembly of claim 4 wherein said lamination layers are Invar and said ceramic dielectric sheet is silicon nitride.

6. The probe head assembly of claim 2 wherein each of said plurality of lamination layers has elongated metallic grains offset from each adjacent ones of said plurality of lamination layers.

7. The probe head assembly of claim 6 wherein each of said plurality of lamination layer has elongated metallic grains offset from each adjacent ones of said plurality of lamination layers by about 90°.

8. The probe head assembly of claim 6 wherein said lamination layers are Invar and said ceramic dielectric sheet is silicon nitride.

9. The probe head assembly of claim 2 wherein said plurality of lamination layers extend from an innermost layer to an outermost layer and said aperture has a larger perimeter in said outermost layer than in said innermost layer, thereby forming a shelf.

10. The probe head assembly of claim 9 wherein said dielectric sheet is a ceramic that is supported by said shelf.

11. The probe head assembly of claim 10 wherein said ceramic sheet is adhesively bonded to said shelf.

12. The probe head assembly of claim 11 wherein each of said plurality of lamination layers has elongated metallic grains offset from each adjacent ones of said plurality of lamination layers.

13. The probe head assembly of claim 12 wherein each of said plurality of lamination layer has elongated metallic grains offset from each adjacent ones of said plurality of lamination layers by about 90°.

14. The probe head assembly of claim 13 wherein said lamination layers are Invar and said ceramic dielectric sheet is silicon nitride.

15. The probe head assembly of claim 14 wherein said spacer member has a flatness variation of less than 0.0002 inch per inch.

* * * * *